(12) United States Patent
Hubert (10) Patent No.: US 9,158,090 B2
(45) Date of Patent: Oct. 13, 2015

(54) CAMERA MODULE WITH ARTIFICIAL MUSCLE ACTUATOR AND STRUCTURE FOR FOCUSING DURING ASSEMBLY

(71) Applicant: Apple Inc., Cupertino, CA (US)

(72) Inventor: Aurelien Hubert, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 101 days.

(21) Appl. No.: 14/137,832

(22) Filed: Dec. 20, 2013

(65) Prior Publication Data

US 2015/0177477 A1    Jun. 25, 2015

(51) Int. Cl.
| | |
|---|---|
| H04N 5/232 | (2006.01) |
| G03B 13/00 | (2006.01) |
| G02B 7/04 | (2006.01) |
| G02B 13/00 | (2006.01) |
| H04N 5/225 | (2006.01) |
| H05K 13/00 | (2006.01) |
| G02B 15/14 | (2006.01) |

(52) U.S. Cl.
CPC ............... *G02B 7/04* (2013.01); *G02B 13/001* (2013.01); *H04N 5/2254* (2013.01); *H04N 5/23296* (2013.01); *H05K 13/0023* (2013.01)

(58) Field of Classification Search
CPC ............ G02B 7/04; G03B 2205/0076; G03B 2205/0084; G03B 2205/0069; G03B 2205/0061; G03B 2205/0053
USPC .................................. 348/357; 359/694, 824
See application file for complete search history.

(56) References Cited

U.S. PATENT DOCUMENTS

| | | |
|---|---|---|
| 7,046,296 B2 | 5/2006 | Shinomiya |
| 7,091,571 B1 | 8/2006 | Park et al. |
| 7,233,737 B2 | 6/2007 | DeMonte |
| 7,573,646 B2 | 8/2009 | Craen et al. |
| 7,679,839 B2 | 3/2010 | Polyakov et al. |
| 7,940,476 B2 | 5/2011 | Polyakov et al. |
| 2006/0208609 A1 | 9/2006 | Heim |
| 2007/0097528 A1 | 5/2007 | Hagiwara et al. |
| 2008/0144186 A1* | 6/2008 | Feng et al. ..................... 359/666 |
| 2009/0040361 A1* | 2/2009 | Heim et al. ..................... 348/340 |
| 2009/0147340 A1* | 6/2009 | Lipton et al. .................. 359/230 |
| 2009/0147377 A1 | 6/2009 | Polyakov et al. |
| 2010/0033835 A1* | 2/2010 | Heim et al. ..................... 359/683 |
| 2010/0084726 A1 | 4/2010 | Lee et al. |
| 2012/0075519 A1 | 3/2012 | Blasch |
| 2012/0075520 A1 | 3/2012 | Tecu |
| 2014/0168799 A1* | 6/2014 | Hubert et al. ................. 359/824 |
| 2015/0085180 A1* | 3/2015 | Gleason et al. .............. 348/357 |

FOREIGN PATENT DOCUMENTS

CN          102053336 A          5/2011

* cited by examiner

*Primary Examiner* — Kelly L Jerabek
(74) *Attorney, Agent, or Firm* — Blakely, Sokoloff, Taylor & Zafman LLP (57) ABSTRACT

A camera module includes an image sensor having a first threaded portion. A lens assembly includes an electro-active polymer (EAP) structure having a frusto-conical shape with an opening formed in the tip. A lens is secured to a lens holder that is attached to the EAP structure surrounding the opening. A first electrode is attached to a rear face of the EAP structure and extends along a side. A second electrode is attached to the rear face of the EAP structure along the tip. A base frame is attached to the base of the EAP structure. The base frame includes a second threaded portion that engages the first threaded portion, joining the lens assembly to the image sensor assembly and allowing the lens assembly to be rotated relative to the image sensor to adjust the distance between the lens assembly and the image sensor to establish a default focal distance.

20 Claims, 5 Drawing Sheets

CAMERA MODULE WITH ARTIFICIAL MUSCLE ACTUATOR AND STRUCTURE FOR FOCUSING DURING ASSEMBLY

BACKGROUND

1. Field

Embodiments of the invention relate to the field of digital camera modules; and more specifically, to structures for setting the initial focus position during factory assembly.

2. Background

Many portable electronic devices, such as mobile cellular telephones, include a digital camera. The lenses for such cameras must be compact to fit within the case of the portable electronic device. At the same time there is a desire to provide an increasingly high quality camera function in these devices. To provide a higher quality image, some cameras found in portable electronic devices provide an autofocus feature and/or an adjustable iris to control exposure.

An image sensor, lens, and actuators for the lens are typically assembled into a camera module. The lens may be mounted in a actuator that moves the lens along its optical axis to change the distance between the lens and the image sensor. This changes the focal distance of the camera and allows a sharper image to be obtained for subjects over a greater range of distances from the camera. One such lens moving mechanism for moving a lens is a voice coil motor. Voice coil motors are relatively complex assemblies with a number of parts. Voice coil motors also consume a significant amount of power. The addition of an adjustable iris further increases mechanical complexity and power consumption in the camera module.

It would be desirable to provide a camera module that provides a focus actuator and adjustable iris with a structure that reduces mechanical complexity and power consumption.

SUMMARY

An embodiment of the invention described here is an artificial muscle or EAP actuator that also provides a variable aperture, for use with moveable camera imaging optics. An electrode arrangement is formed in an EAP structure that may achieve both camera optics displacement (actuation) and variable aperture functions.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the invention will now be described with reference to the drawings summarized below. The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions, and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

In the following description, reference is made to the accompanying drawings, which illustrate several embodiments of the present invention. It is understood that other embodiments may be utilized, and mechanical compositional, structural, electrical, and operational changes may be made without departing from the spirit and scope of the present disclosure. The following detailed description is not to be taken in a limiting sense, and the scope of the embodiments of the present invention is defined only by the claims of the issued patent.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

Figure 1:
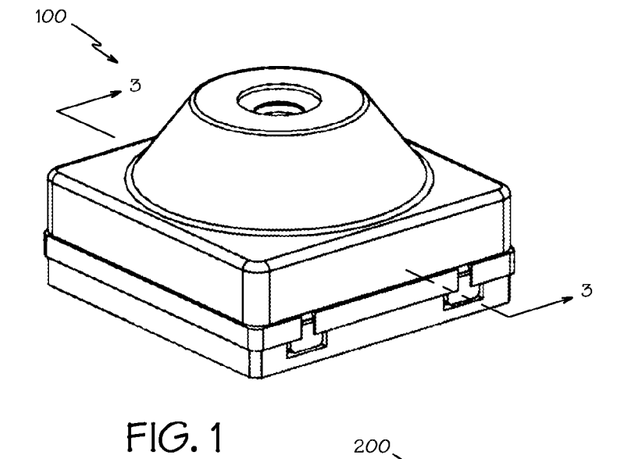
FIG. 1 is a pictorial view of a camera module that embodies the invention.
Figure 2:
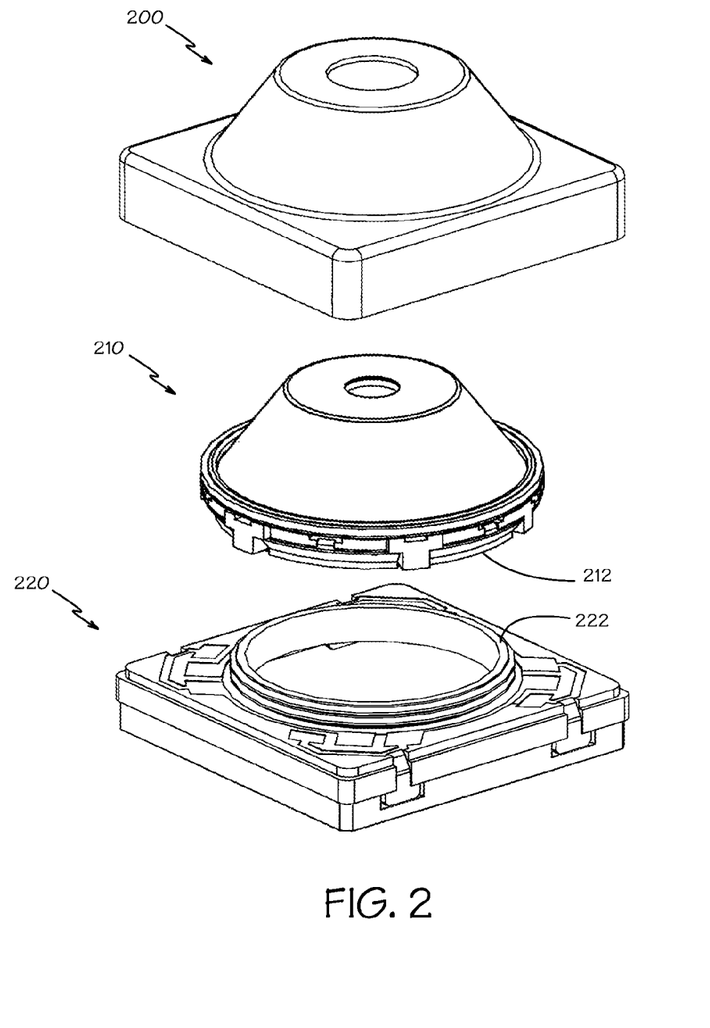
FIG. 2 is an exploded view of the camera module of FIG. 1, showing the sub-assemblies of the module.

FIG. 1 is a pictorial view of a camera module 100 that embodies the invention. FIG. 2 is an exploded view of the camera module 100, showing the sub-assemblies of the module. A base assembly 220 supports an optical assembly 210 that is covered by a shield 200. The base assembly 220 provides a threaded portion 222 to mate with a corresponding threaded portion of an assembly focus ring 212 of the optical assembly 210. The threaded connection between the base assembly 220 and the optical assembly 210 allows the optical assembly to be focused on an image sensor in the base assembly during the manufacturing process as will be further described below.

Figure 3:
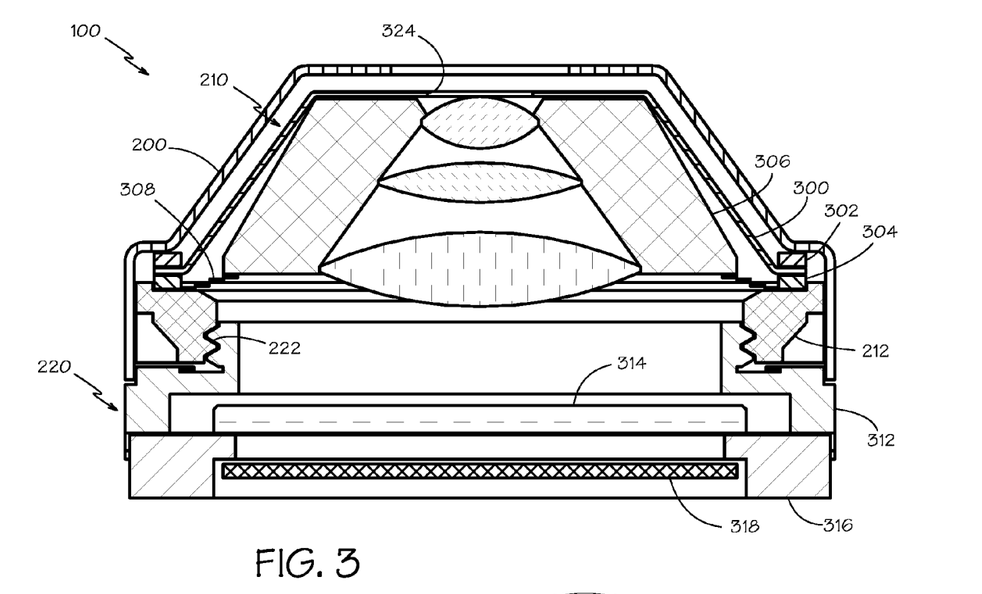
FIG. 3 is a cross-section view of the camera module taken along section line 3-3 in FIG. 1.

FIG. 3 is a cross-section view of the camera module 100, taken along section line 3-3 in FIG. 1. The base assembly 220 may include a substrate 316 (e.g., a printed circuit carrier such as a flex circuit) that supports an image sensor 318 and a cover glass 314, which may be an infrared cut filter that reduces the amount of infrared light that reaches the image sensor. A base frame 312 may be assembled to the substrate 316 to provide the aforementioned threaded portion 222 and electrical tracks as will be further described below. The base frame 312 may include an opening that allows light from a scene to reach the active pixel area of the image sensor 318. The base frame 312 may be made of an electric insulator material such as plastic. If the base frame 312 is made of a sufficiently clear light transparent material, then the physical opening shown in FIG. 3 may not be needed.

The optical assembly 210 includes a lens assembly 306 that provides the imaging optics for the camera module 100. The lens assembly 306 is supported by springs 308 that are supported in turn by the assembly focus ring 212. The lens assembly 306 is held against the springs 308 by the artificial muscle actuator 300 that provides lens displacement for focusing as well as the variable aperture. The artificial muscle actuator 300 may be part of an autofocus lens subsystem, for example. The artificial muscle is an electroactive polymer (EAP) that exhibits a change in size or shape when stimulated by an electric field. A common terminal ring 302 and a signal terminal ring 304 provide electrical connections to the artificial muscle actuator 300 as will be further described below.

Figure 4:
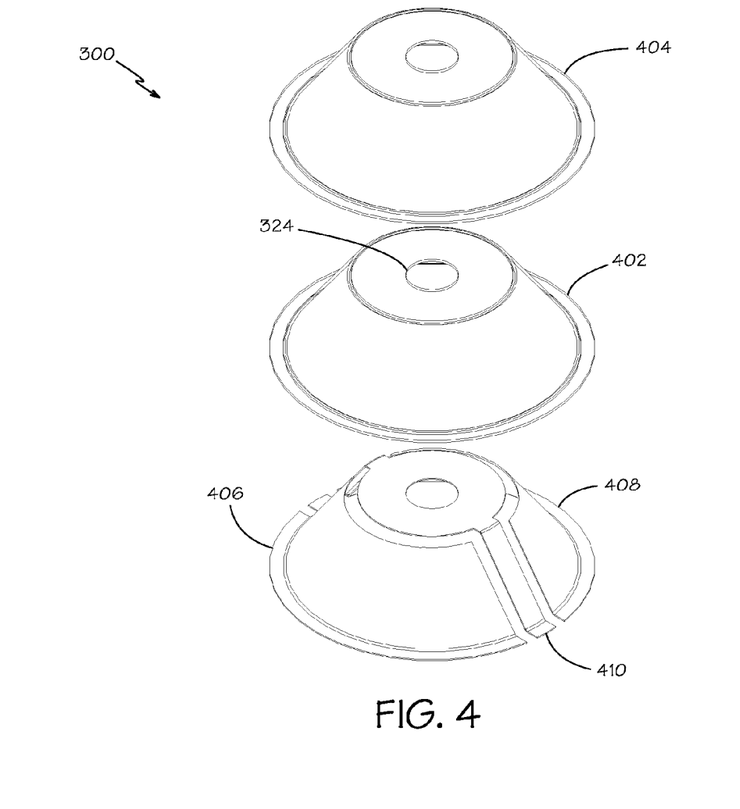
FIG. 4 is an exploded pictorial view of an exemplary artificial muscle actuator structure.
Figure 5:
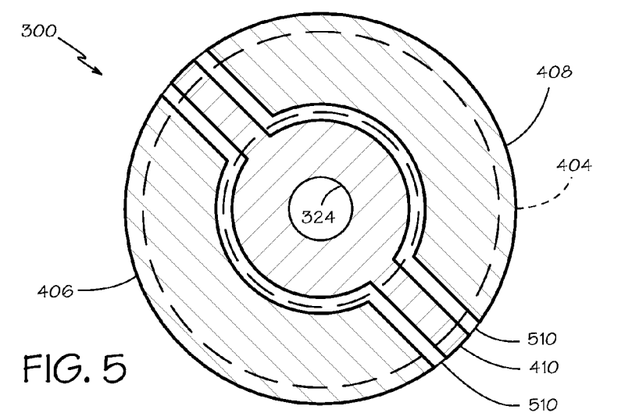
FIG. 5 is a bottom view of the exemplary artificial muscle actuator structure looking from the image sensor toward the lens.

FIG. 4 is an exploded pictorial view of an exemplary artificial muscle actuator 300 structure. FIG. 5 is a bottom view of the exemplary artificial muscle actuator 300 structure looking from the image sensor 318 toward the lens 306. In this case, the muscle structure is generally frusto-conical, and as seen in FIG. 2, its larger lower base is attached to the assembly focus ring 212 (e.g., via a clamping mechanism). The smaller upper base of the frusto-conical structure (or frustum) has a central, generally circular opening 324 that serves as a variable aperture.

The artificial muscle may have a structure of one or more layers of silicon based polymers that react to a differential of potential between two electrodes that cover the polymer layers. This potential differential creates a sufficient electric field that activates the conductive particles of the polymer material, and creates a significant amount of force through the material to provide elongation. As a result, the structure may strain along its length proportionally to the square of the voltage input.

The strain in the artificial muscle actuator 300 is used here for at least two different purposes. An electrode arrangement is formed on the artificial muscle structure (EAP structure) that may achieve both camera lens displacement actuation and variable aperture functions.

For lens focus actuation, the artificial muscle can move a lens or other optics forward and backward (or up and down) along the imaging axis of the lens. This may yield significant cost reduction versus a voice coil actuator (VCM). The artificial muscle actuator may support large optics with improved system integration due to its generally frusto-conical shape. Power consumption may be minimal.

As a variable aperture element, the actuator may be able to change an aperture diameter of the optics in smaller f-number increments, and it can support relatively large aperture diameters thereby yielding fast optics and better low light performance. To combine lens focus actuation and variable aperture features, a "focus actuation electrode" of the muscle is separated (electrically isolated) from an "aperture electrode" that is used to provide the variable aperture.

An electroactive polymer (EAP) 402 is between positive and negative electrodes that create an electrical potential across the EAP. The muscle 402 is activated (deforms) when a sufficient electric field is created through and across the artificial muscle structure, due to sufficient voltage being applied to the opposing or complementary electrodes (formed on opposite faces of the muscle). These so-called positive and negative electrodes may be screen-printed onto the rear and front surfaces, respectively, of the EAP material, in such a way that the positive and negative electrodes substantially overlap each other to increase the electric field strength that is created between them. In one embodiment, to enable displacement of optics, the driver circuit may need to deliver around 500V to 1000V potential to the electrode, through its respective terminal, relative to ground. In one embodiment, the negative electrode of the actuator is also connected to ground.

In this example, the forward surface 404, which is adjacent the shield 200, is the common, negative electrode. The shield 200 is connected to ground to provide some immunity from electromagnetic interference. As best seen in bottom view of FIG. 5, the positive focus actuation electrode has two segments 406, 408, each segment covering a little less than one half of the entire side surface area of the rear side of the EAP frustum 402 closest to the image sensor 318. A "gap" 510 is formed between the two segments that may extend from one edge of the base, up to the tip and then down to an opposite edge of the base, as shown in the bottom view of FIG. 5.

The positive aperture electrode 410, which in this case has a single segment, lies in the gap 510. In this example, the positive aperture electrode 410 has two arms that extend down from the tip of the frustum on opposite sides, to opposing edges of the base of the frustum. As also seen in FIG. 5, the positive aperture electrode 410 covers essentially the entire surface area of the tip (with the central opening therein that serves as the variable aperture). Note however that the particular arrangement of the electrodes shown in FIGS. 4 and 5 is just one example of how the positive electrode (actuation and aperture portions) can be formed on the inner or rear face of a frusto-conical muscle. Other electrode patterns are possible.

A focusing force F1 may be produced by the actuator 300 in its non-energized state, where F1 may be substantially along the imaging axis in a so-called rearward direction that moves the lens assembly 306 toward the image sensor 318. An opposing force F2 is produced by the spring 308 that urges the lens assembly 306 away from the image sensor 318. When the actuator 300 deforms in response to a potential difference between the common, negative electrode 404 and the positive focus actuation electrode 406, 408, the focusing force F1 is reduced allowing the opposing force F2 produced by the spring 308 to move the lens assembly 306 away from the image sensor 318. The forces act upon the lens assembly 306, in which the lenses may be rigidly fixed, to move the lens assembly forward and backward as necessary for focusing an image on the image sensor 318.

A variable aperture function may be produced by the actuator 300 deforming in response to a potential difference between the common, negative electrode 404 and the positive aperture electrode 410. As the annular portion at the tip of the EAP frustrum deforms in response to an increasing potential difference delta$_P$ as distributed to the aperture electrodes, the circular opening 324 decreases in diameter, providing a higher f-number for the variable aperture.

FIG. 3 depicts an example of the infinity lens position that can be obtained from the actuator when not energized. In this case, the artificial muscle is under pre-tension (material elasticity in the side surface of the frustum in the longitudinal direction or along a length direction of the frustum), when it is not active. In this state, this pre-tension is compressing the spring mechanism (spring loading). Now, when the potential difference delta$_P$ as distributed to the actuator electrodes has been increased sufficiently, the pre-tension of the muscle releases, thereby allowing the lens barrel to be pushed up away from the image sensor under the spring loading. The shield 200 may provide a hard stop that defines the maximum actuator stroke possible.

The infinity lens position obtained from the actuator when not energized is typically set when the camera module is assembled. This may be accomplished by rotating the assembly focus ring 212 at the lower end of the artificial muscle actuator 300 to adjust the distance between the optical assembly 210 and the image sensor 318 by the screw action between the threaded portion of the assembly focus ring 212 with the corresponding threaded portion 222 of the base 312.

The near end of the artificial muscle actuator 300 may be fixed against the assembly focus ring 212 by capturing the near end between the common terminal ring 302 and the signal terminal ring 304. The terminal rings are, in turn, attached to the assembly focus ring 212. The assembly focus ring 212 is coupled to the base 312 by engaging the threaded portion of the assembly focus ring 212 with the corresponding threaded portion 222 of the base.

Figure 6:
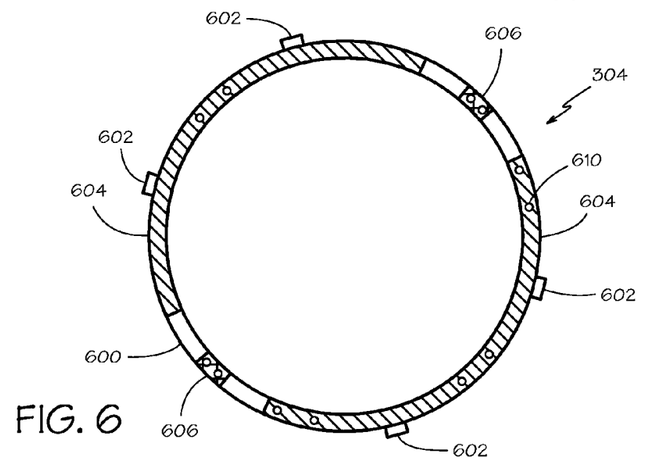
FIG. 6 is a plan view of the top side of a signal terminal ring.

FIG. 6 is a plan view of the top side of the signal terminal ring 304, which may be bonded to the artificial muscle actuator 300 by a conductive adhesive such as epoxy or tape. The signal terminal ring body 600 may be made of a non-conductive material such as a glass fiber and epoxy composite. The signal terminal ring body 600 may include features such as tabs 602 to facilitate orienting and holding the signal terminal ring during assembly.

A number of conductive pads are provided on the top side of the signal terminal ring 304 to provide electrical connections to the positive focus electrodes on the lower surface of the artificial muscle actuator 300. The exemplary signal terminal ring 304 provides two upper conductive pads 604 to be coupled to the two segments 406, 408 of the positive focus actuation electrode. The exemplary signal terminal ring 304 also provides two upper conductive pads 606 to be coupled to the two ends 310 of the positive aperture electrode 410.

Figure 7:
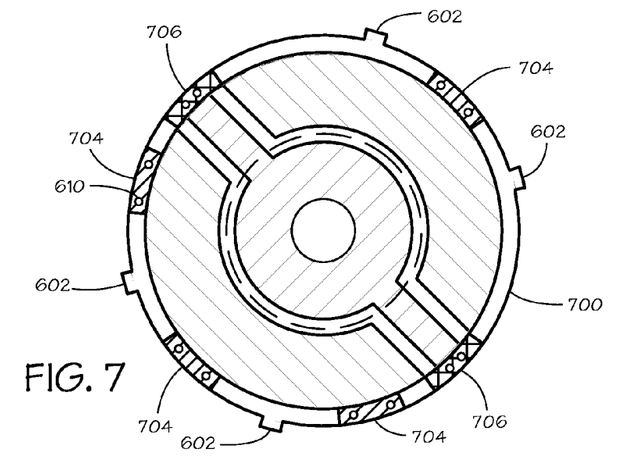
FIG. 7 is a plan view of the bottom side of the signal terminal ring shown bonded to the artificial muscle actuator.

FIG. 7 is a plan view of the bottom side of the signal terminal ring 304 shown bonded to the artificial muscle actuator 300. A number of conductive pads are provided on the bottom side of the signal terminal ring 304 to provide electrical connections from the positive focus electrodes on the lower surface of the artificial muscle actuator 300 to the exemplary signal terminal ring 304. The terminal ring provides four lower conductive pads 704 to be coupled to the two segments 406, 408 of the positive focus actuation electrode.

The exemplary signal terminal ring 304 also provides two lower conductive pads 706 to be coupled to the two ends of the positive aperture electrode 410. The upper and lower conductive pads are electrically coupled, such as by vias 710, that provide an electrical path across the signal terminal ring body 600.

The signal terminal ring 304 is mechanically and electrically coupled to the assembly focus ring 212.

It will be seen in the exemplary signal terminal ring 304 that the lower conductive pads on the bottom side of the signal terminal ring are smaller and more widely separated than the corresponding upper conductive pads on the top side of the signal terminal ring. This may facilitate making electrical connections to the assembly focus ring 212.

The lower conductive pads are arranged to cooperate with conductive pads on the base 312 so that at least one lower conductive pad is aligned with a corresponding base conductive pad for each of the positive electrodes regardless of the angular position of the signal terminal ring 304.

Figure 8:
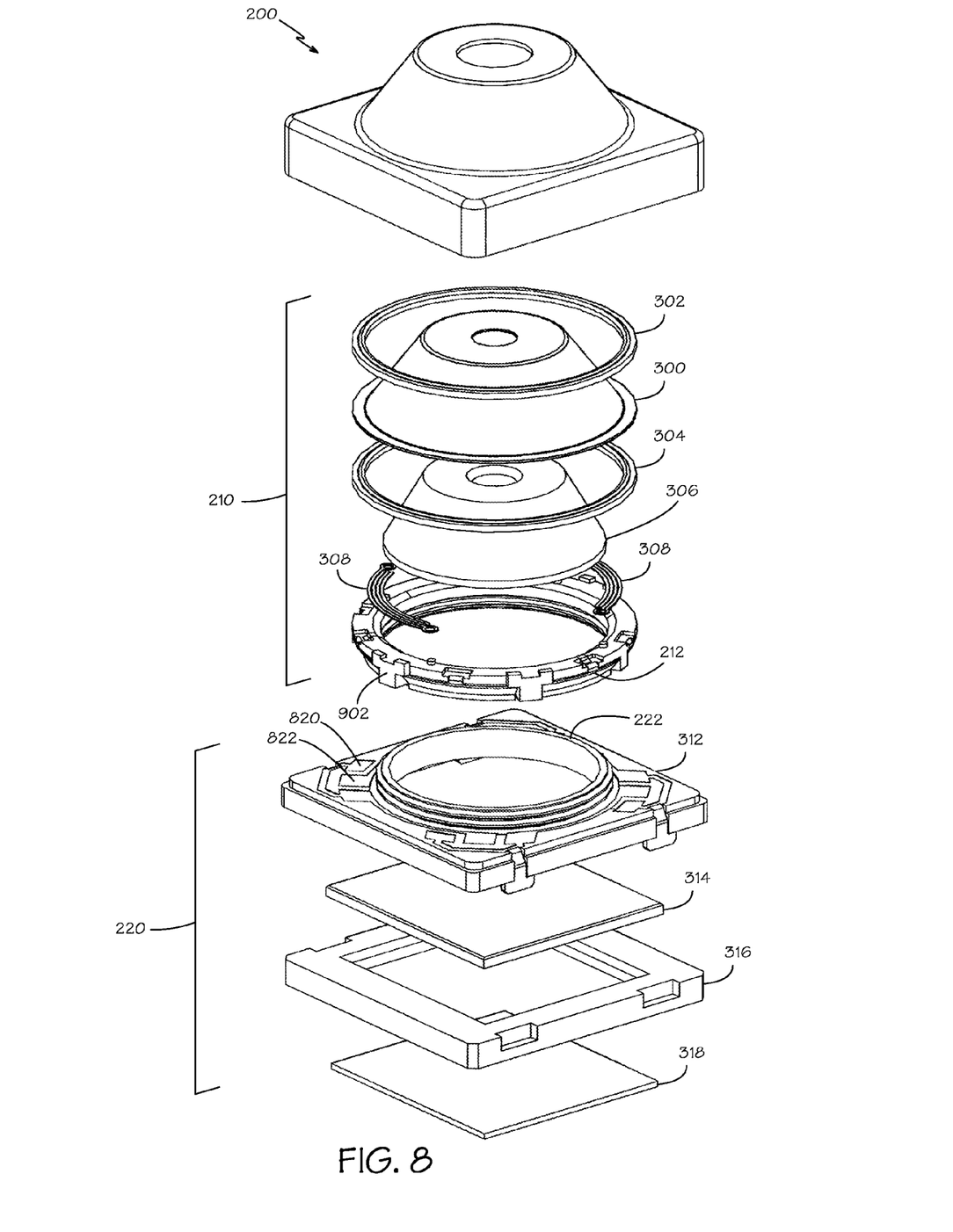
FIG. 8 is a further exploded view of the camera module of FIG. 2, showing component parts of the sub-assemblies.

FIG. 8 is a further exploded view of the camera module 100, showing component parts of the sub-assemblies. The base assembly 220 may include the substrate 316 (e.g., a printed circuit carrier such as a flex circuit) that supports the image sensor 318 and the cover glass 314, which may be an infrared cut filter that reduces the amount of infrared light that reaches the image sensor. The base frame 312 may be assembled to the substrate 316 to provide the threaded portion 222 and electrical tracks as will be further described below. The base frame 312 may include an opening or be made of a sufficiently clear light transparent material to allow light from a scene to reach the active pixel area of the image sensor 318.

The optical assembly 210 includes the lens assembly 306 that provides the imaging optics for the camera module 100. The lens assembly 306 is supported by springs 308 that are supported in turn by the assembly focus ring 212. The lens assembly 306 is held against the springs 308 by an artificial muscle actuator 300 that provides lens displacement for focusing as well as a variable aperture. The artificial muscle actuator 300 may be part of an autofocus lens subsystem, for example. The artificial muscle is an electroactive polymer (EAP) that exhibits a change in size or shape when stimulated by an electric field. A common terminal ring 302 and a signal terminal ring 304 provide electrical connections to the artificial muscle actuator 300.

The camera module 100 is assembled by assembling the component parts into the sub-assemblies of the base assembly 220, the optical assembly 210, and the shield 200, which may be a single component. The optical assembly 210 is first coupled to the base assembly 220. The optical assembly 210 is coupled to the base assembly 220 by the threaded connection between the assembly focus ring 212 and the threaded portion 222 of the base assembly. The threaded connection allows the lens assembly 306 to be focused on the image sensor 318 during the assembly process to provide a reference focal position for the autofocus system. The shield 200 is then coupled to the base assembly 220 to enclose the optical assembly 210 and form the camera module 100.

It is also necessary to electrically couple the optical assembly 210 to the base assembly 220 to provide the electrical signals that actuate the artificial muscle actuator 300. At least two terminals 820, 822 are formed on the base frame 312, to bring a differential of potential up to the electrodes 406, 408, 410 of the artificial muscle actuator 300. One terminal 820 may be connected to the focus actuation electrode 406, 408. Another terminal 822 may be connected to the aperture electrode 410. The two terminals 820, 822 may be driven by separately controllable driver circuits. Each terminal may be electrically connected to a driver circuit (not shown) through conductive traces or routes (not shown) in the substrate 316, which produces sufficient voltage needed for the desired deformation of the artificial muscle actuator 300.

Figure 9:
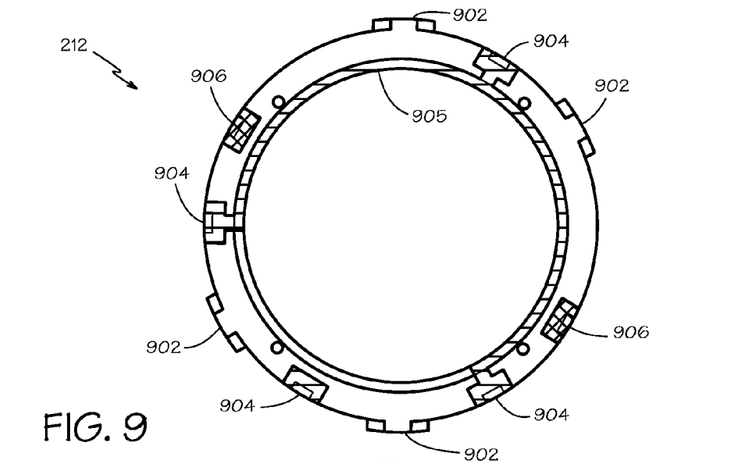
FIG. 9 is a plan view of the top side of the assembly focus ring.

FIG. 9 is a plan view of the top side of the assembly focus ring 212. The top side of the assembly focus ring is immediately adjacent the bottom side of the signal terminal ring 304 as seen in FIG. 7. The signal terminal ring 600 may be mechanically aligned to the assembly focus ring 212 by engaging features on the signal terminal ring, such as tabs 602, with mating features on the assembly focus ring, such as notches 902. This may hold the signal terminal ring 304 in the proper orientation on the assembly focus ring 212 during assembly. The conductive pads 704, 706 on the signal terminal ring 304 face corresponding conductive pads 904, 906 on the assembly focus ring 212. The corresponding conductive pads are mechanically and electrically coupled such as by soldering or by a conductive adhesive such as epoxy or tape.

There are at least two conductive pads 904, 906 on the assembly focus ring 212, at least one of which is coupled to the focus actuation electrode 406, 408 and at least one other of which is coupled to the aperture electrode 410. If there are two or more conductive pads on the assembly focus ring 212 that are coupled to the same electrode on the artificial muscle actuator 300, the conductive pads on the assembly focus ring may be electrically coupled by an electrical path 905 on the assembly focus ring.

Figures 10, 11, 12:
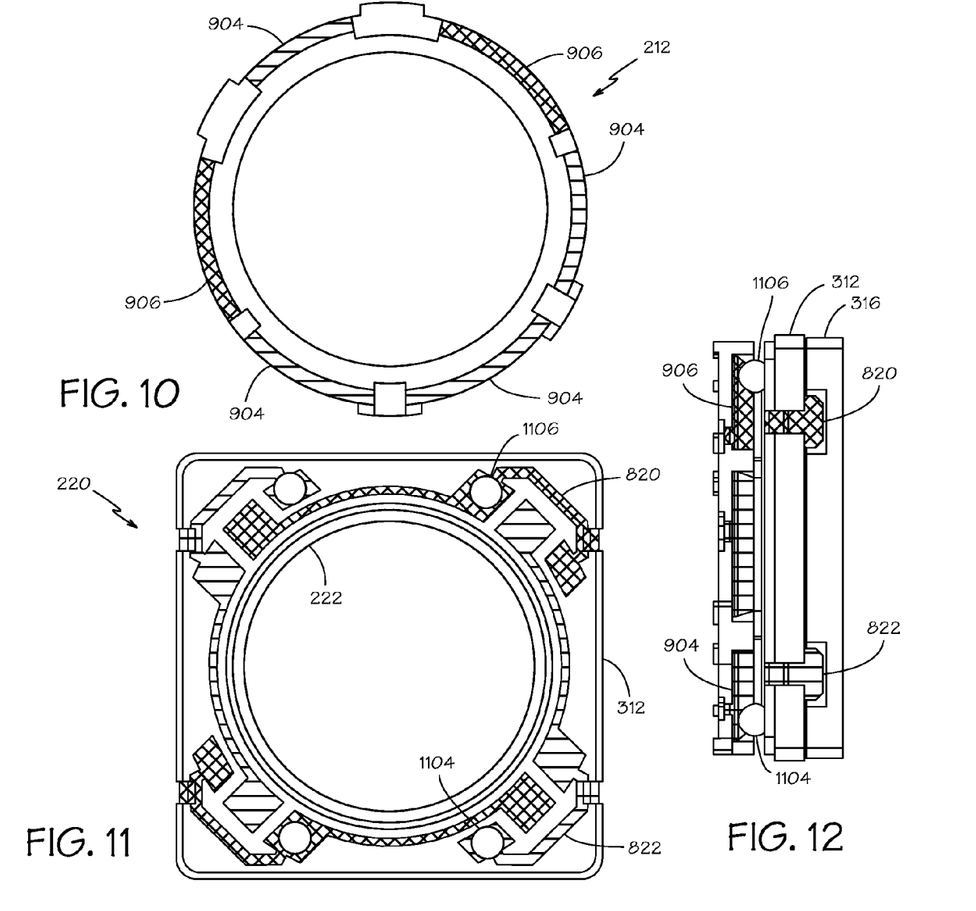
FIG. 10 is a plan view of the bottom side of the assembly focus ring.
FIG. 11 is a plan view of the top side of the base assembly.
FIG. 12 is a side view of the assembly focus ring on the threaded portion of the base assembly.

FIG. 10 is a plan view of the bottom side of the assembly focus ring 212. The bottom side of the assembly focus ring is immediately adjacent the base assembly 220. The conductive pads 904, 906 on the assembly focus ring 212 extend onto the bottom side of the assembly focus ring. The conductive pads 904, 906 may be on a beveled outside surface of the bottom side of the assembly focus ring as best seen in FIG. 3. The conductive pads 904, 906 on the bottom side of the assembly focus ring 212 are arranged to cover a majority of the circumference of the assembly focus ring. The conductive pads 904, 906 on the bottom side of the assembly focus ring 212 are further arranged such that each of the at least two conductive pads 904, 906 on the assembly focus ring 212 covers more than 90 degrees of total arc on the circumference of the assembly focus ring.

FIG. 11 is a plan view of the top side of the base assembly 220. The top side of the base assembly is immediately adjacent the bottom side of the assembly focus ring 212 as seen in FIG. 10. The optical assembly 210 is mechanically coupled to the base assembly 220 by the threaded engagement of the assembly focus ring 212 on the threaded portion 222 of the base assembly. The optical assembly 210 is rotated relative to the base assembly 220 to adjust the initial focus of the camera module 100 during the assembly process.

At least two terminals 820, 822 are formed on the base frame 312, to bring a differential of potential up to the electrodes 406, 408, 410 of the artificial muscle actuator 300. As seen in FIG. 11, the terminals 820, 822 are distributed on the base frame 312 such that each of the two terminals is provided at multiple points around the circumference. For example, in the embodiment illustrated, each of the two terminals is provided at six places around the circumference of the threaded portion 222 of the base assembly 312. The terminals may be advantageously arranged to lie in the four corner regions of a generally square base frame 312.

The arrangement of the conductive pads 904, 906 on the bottom side of the assembly focus ring 212 and the arrangement of the terminals 820, 822 on the base frame 312 are such that at least one of the conductive pads on the bottom side of the assembly focus ring will be adjacent at least one corresponding terminal on the base frame regardless of the relative orientation of the optical assembly 210 to the base assembly 220. When the optical assembly 210 is correctly focused, at least one of the conductive pads on the bottom side of the assembly focus ring is mechanically and electrically coupled to an adjacent corresponding terminal on the base frame 312 for each of the two terminals on the base frame.

FIG. 12 is a side view of the 212 on the threaded portion 222 of the base assembly. The corresponding conductive pads and terminals are mechanically and electrically coupled 1104 such as by soldering or by an electrically conductive adhesive such as silver conductive epoxy. This coupling provides both an electrical path for the electrical signals that actuate the artificial muscle actuator 300 and a mechanical fixing of the assembly focus of the optical assembly 210 on the image sensor 318 in the base assembly 220. It will be appreciated that beveling at least one of the corresponding conductive pads and terminals provides a V-shaped region, which may be advantageous for the coupling of the pads and terminals.

Assembly of the camera module 100 is completed by placing the shield assembly 200 over the optical assembly 210. The shield assembly is mechanically and electrically coupled to the shield to terminals 224 on the base assembly 220. The shield and terminals are mechanically and electrically coupled such as by soldering or by a conductive adhesive such as epoxy or tape. This coupling provides both an electrical path for the common electrical signal that actuates the artificial muscle actuator 300 and a mechanical fixing of the shield 200 to the base assembly 220. The shielding structure 200 may be electrically grounded through the substrate 316. The shielding structure 200 may provide shielding against electromagnetic interference.

For purposes of explanation, specific embodiments were described to provide a thorough understanding of the present invention. These should not be construed as limiting the scope of the invention but merely as illustrating different examples and aspects of the invention. It should be appreciated that the scope of the invention includes other embodiments not discussed in detail above. Various other modifications, changes, and variations which will be apparent to those skilled in the art may be made in the arrangement, operation, and details of the systems and methods of the present invention disclosed herein without departing from the spirit and scope of the invention as defined in the appended claims. Therefore, the scope of the invention should be determined by the claims and their legal equivalents. Such equivalents include both currently known equivalents as well as equivalents developed in the future, i.e. any elements developed that perform the same function, regardless of structure. Furthermore, no element, component, or method step is intended to be dedicated to the public regardless of whether the element, component, or method step is explicitly recited in the claims.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. An optical assembly comprising:
   an artificial muscle actuator having a lower base and an upper base that includes a central opening;
   a lens assembly attached to the upper base of the artificial muscle actuator;

a first electrode portion attached to the artificial muscle actuator and extending from the upper base to the lower base; and an assembly focus ring attached to the lower base of the artificial muscle actuator, the assembly focus ring including
- a threaded portion that engages a corresponding threaded portion of an image sensor assembly to join the lens assembly to the image sensor assembly, and
- a first conductive pad that extends from a top side to a bottom side of the assembly focus ring, the first conductive pad on the top side being electrically coupled to the first electrode portion of the artificial muscle actuator, the first conductive pad on the bottom side to electrically join the first electrode portion to the image sensor assembly.

2. The optical assembly of claim 1 further comprising a second electrode portion electrically isolated from the first electrode portion and attached to the upper base of the artificial muscle actuator.

3. The optical assembly of claim 2 wherein the second electrode portion has an opening that is aligned with the central opening in the artificial muscle actuator.

4. The optical assembly of claim 2 further comprising a second conductive pad electrically isolated from the first conductive pad, the second conductive pad extending from the top side to the bottom side of the assembly focus ring, the second conductive pad on the top side being electrically coupled to the second electrode portion of the artificial muscle actuator, the second conductive pad on the bottom side to electrically join the second electrode portion to the image sensor assembly.

5. The optical assembly of claim 1 wherein the artificial muscle actuator has a generally frusto-conical shape.

6. The optical assembly of claim 1 wherein the lens assembly has an optical axis centered in the central opening in the upper base of the artificial muscle actuator.

7. The optical assembly of claim 1 wherein the bottom side of the assembly focus ring is beveled to provide a V-shaped region between the first conductive pad and the image sensor assembly.

8. A camera module comprising:
an image sensor assembly;
a base plate attached to the image sensor assembly, the base plate including a first threaded portion; and
an optical assembly including
- an artificial muscle actuator having a lower base and an upper base that includes a central opening;
- a lens assembly attached to the upper base of the artificial muscle actuator;
- a first electrode portion attached to the artificial muscle actuator and extending from the upper base to the lower base; and
- an assembly focus ring attached to the lower base of the artificial muscle actuator, the assembly focus ring including a threaded portion that engages the first threaded portion of the base plate to join the lens assembly to the image sensor assembly, and a first conductive pad that extends from a top side to a bottom side of the assembly focus ring, the first conductive pad on the top side being electrically coupled to the first electrode portion of the artificial muscle actuator, the first conductive pad on the bottom side mechanically and electrically coupled to the image sensor assembly.

9. The camera module of claim 8 wherein the optical assembly further includes a second electrode portion electrically isolated from the first electrode portion and attached to the upper base of the artificial muscle actuator.

10. The camera module of claim 9 wherein the second electrode portion has an opening that is aligned with the central opening in the artificial muscle actuator.

11. The camera module of claim 9 wherein the optical assembly further includes a second conductive pad electrically isolated from the first conductive pad, the second conductive pad extending from the top side to the bottom side of the assembly focus ring, the second conductive pad on the top side being electrically coupled to the second electrode portion of the artificial muscle actuator, the second conductive pad on the bottom side electrically coupled to the image sensor assembly.

12. The camera module of claim 8 wherein the artificial muscle actuator has a generally frusto-conical shape.

13. The camera module of claim 8 wherein the lens assembly has an optical axis centered in the central opening in the upper base of the artificial muscle actuator.

14. The camera module of claim 8 wherein the bottom side of the assembly focus ring is beveled to provide a V-shaped region between the first conductive pad and the base plate in which the first conductive pad is mechanically and electrically coupled to the image sensor assembly.

15. A method of assembling a camera module, the method comprising:
attaching a base plate to an image sensor assembly, the base plate including a first threaded portion;
attaching a lens assembly to an upper base of an artificial muscle actuator;
attaching an assembly focus ring to a lower base of the artificial muscle actuator and electrically coupling a first conductive pad on a top side of the assembly focus ring to a first electrode portion of the artificial muscle actuator;
screwing the assembly focus ring onto the first threaded portion to adjust a distance between the lens assembly and the image sensor assembly to establish a default focal distance; and
mechanically fixing and electrically coupling the first conductive pad on a bottom side of the assembly focus ring to the image sensor assembly.

16. The method of claim 15 further comprising:
electrically coupling a second conductive pad on the top side of the assembly focus ring to a second electrode portion of the artificial muscle actuator; and
mechanically fixing and electrically coupling the second conductive pad on the bottom side of the assembly focus ring to the image sensor assembly.

17. The method of claim 16 further comprising aligning an opening in the second electrode portion with a central opening in the upper base of the artificial muscle actuator.

18. The method of claim 15 wherein the artificial muscle actuator has a generally frusto-conical shape.

19. The method of claim 15 further comprising centering an optical axis of the lens assembly in a central opening in the upper base of the artificial muscle actuator.

20. The method of claim 15 further comprising:
beveling the bottom side of the assembly focus ring to provide a V-shaped region between the first conductive pad and the base plate; and
mechanically fixing and electrically coupling the first conductive pad to the image sensor assembly by at least one of soldering or placing conductive adhesive in the V-shaped region.

\* \* \* \* \*